United States Patent
Oowaki et al.

[11] Patent Number: 5,892,247
[45] Date of Patent: Apr. 6, 1999

[54] SEMICONDUCTOR DEVICE AND A MANUFACTURING METHOD THEREOF

[75] Inventors: Yukihito Oowaki, Yokohama; Mitsuhiro Noguchi, Kawasaki; Tohru Maruyama, Yokohama, all of Japan

[73] Assignee: Kabushiki Kaisha Toshiba, Kawasaki, Japan

[21] Appl. No.: 546,757

[22] Filed: Oct. 23, 1995

[30] Foreign Application Priority Data

Oct. 24, 1994 [JP] Japan ................................. 6-258502
Oct. 24, 1994 [JP] Japan ................................. 6-258525
Oct. 24, 1994 [JP] Japan ................................. 6-258581

[51] Int. Cl.$^6$ ............................................. H01L 31/0328
[52] U.S. Cl. ............................................. 257/194; 257/365
[58] Field of Search .................... 257/365, 366, 257/194, 758

[56] References Cited

U.S. PATENT DOCUMENTS

| | | | |
|---|---|---|---|
| 4,704,622 | 11/1987 | Capasso et al. | 357/4 |
| 5,600,168 | 2/1997 | Lee | 257/365 |
| 5,654,590 | 8/1997 | Kuramochi | 257/758 |

FOREIGN PATENT DOCUMENTS

| | | |
|---|---|---|
| 2 270590 | 3/1994 | United Kingdom . |
| 2 286719 | 8/1995 | United Kingdom . |

OTHER PUBLICATIONS

Applied Physics Letter, vol. 63, No. 16, pp. 2219–2221, Oct. 18, 1993, J. H. Burroughes, et al., "Electronic Properties of a One–Dimensional Channel Field Effect Transistor Formed By Molecular Beam Epitaxial Regrowth on Patterned GaAs".

Primary Examiner—Mark V. Prenty
Attorney, Agent, or Firm—Oblon, Spivak, McClelland, Maier & Neustadt, P.C.

[57] ABSTRACT

The semiconductor device comprises a substrate, a first conductive layer formed on the substrate with a first insulating layer inserted therebetween, thereby to constitute a first gate electrode, a second conductive layer selectively formed on the first gate electrode with a second insulating layer inserted therebetween, and a third conductive layer formed on the first and second conductive layer, thereby to constitute first and second electrodes respectively connected to the first and second conductive layers.

9 Claims, 9 Drawing Sheets

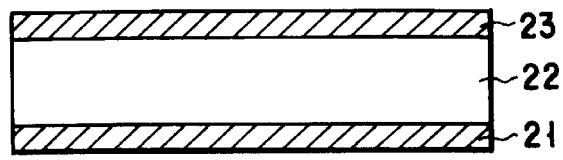
FIG. 6A
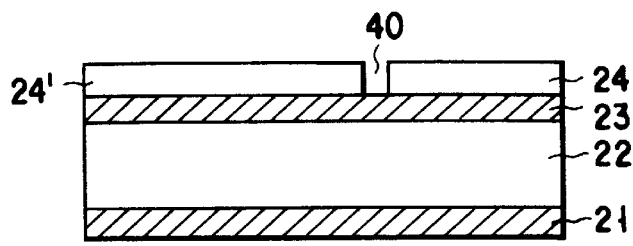
FIG. 6B
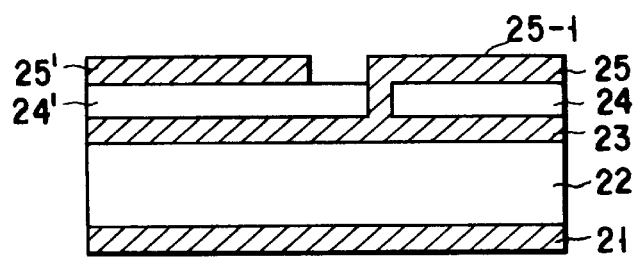
FIG. 6C
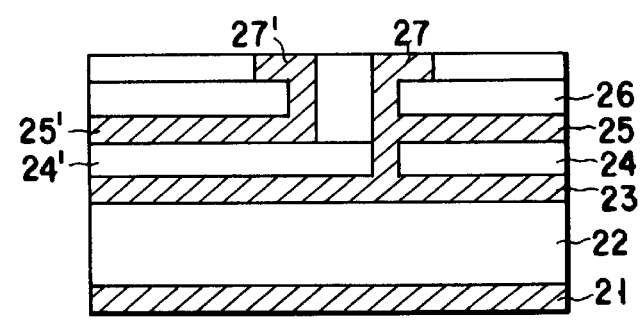
FIG. 6D
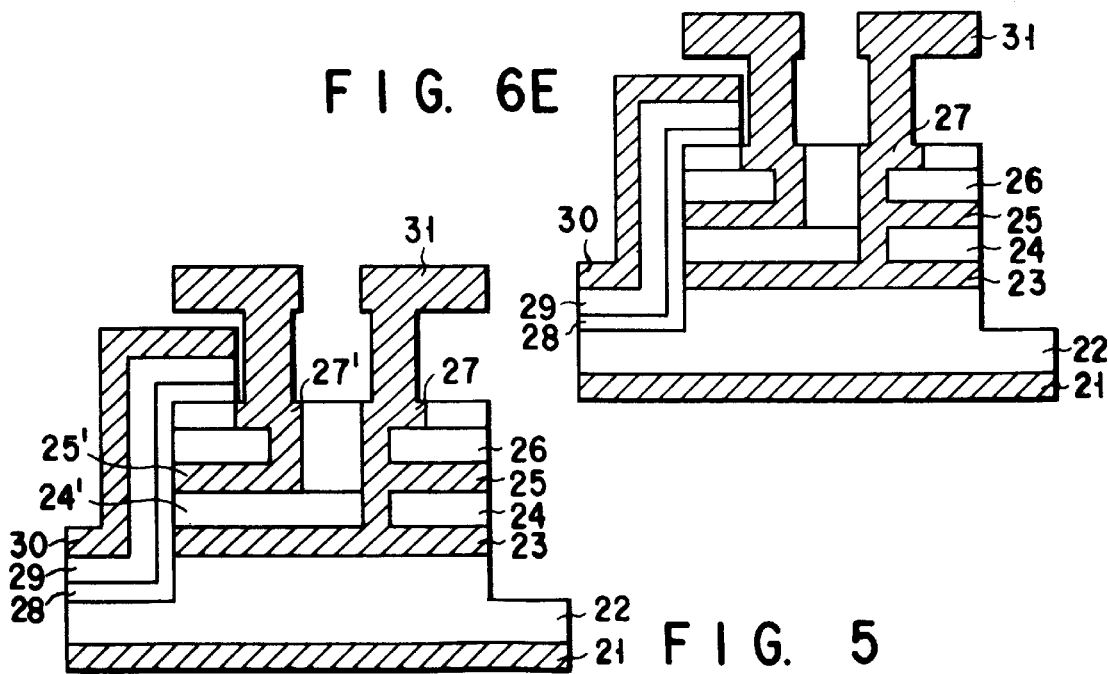
FIG. 6E
FIG. 5

"ON" STATE

"OFF" STATE

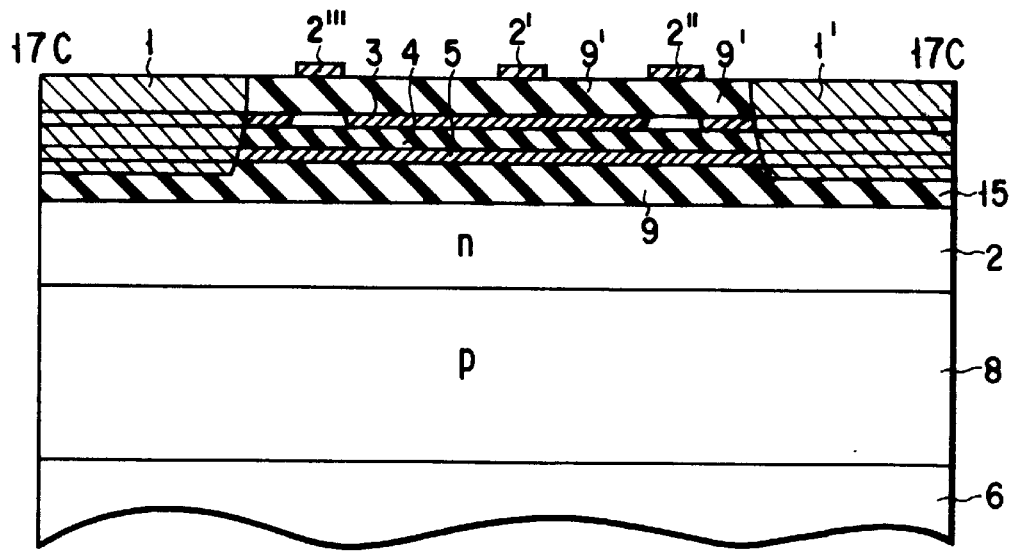
F I G. 20
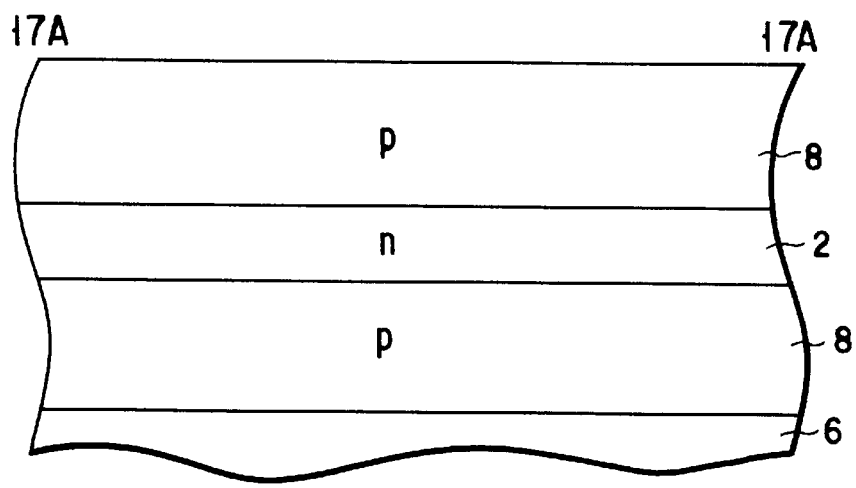
F I G. 21
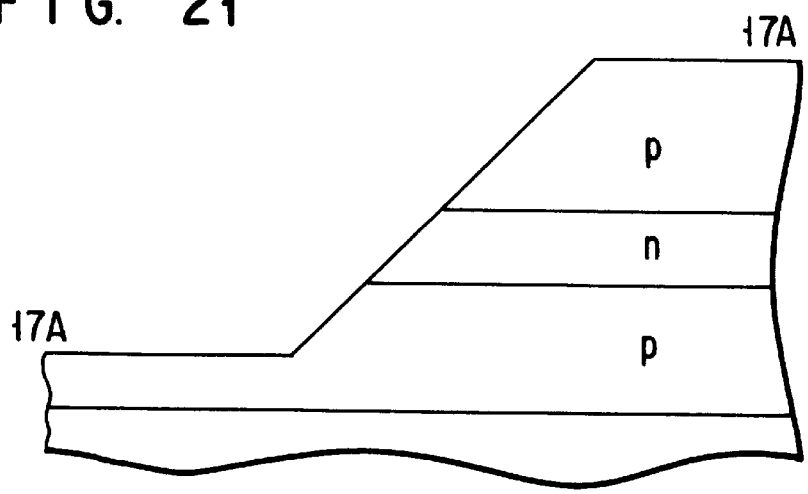
F I G. 22

SEMICONDUCTOR DEVICE AND A MANUFACTURING METHOD THEREOF

BACKGROUND OF THE INVENTION

1. Field of the Invention

The present invention relates to a semiconductor device and a manufacturing method thereof, and more particularly, to a semiconductor device having a transistor (or an HEMT element) and the manufacturing method thereof.

2. Description of the Related Art

As a conventional method of forming a fine small element of an HEMT element adopting modulation doping as shown in FIG. 1, there is a well-known method in which gate electrodes are formed in a layered-structure on a plane, resist material is photo-sensitized by direct drawing with use of electron beams, and the resist material is etched after developing (which is called EB direct drawing).

As shown in FIG. 1, a p-type GaAs layer 22 is formed on an n-type GaAs substrate 21 by a molecular beam epitaxial growth method. Next, an n-type GaAs layer 23 whose side surface is used later as a gate is formed by the molecular beam epitaxial growth method. Further, a p-type GaAs layer 24 is formed, and an HEMT structure consisting of a normal barrier layer 28, a GaAs well layer 29, and a doping layer 30 is formed. Thereafter, the n-type GaAs layer is provided with a contact wiring 31 by a lithography technique.

However, to form a fine small element, and particularly, to form an element having an extremely reduced channel width which is called a quantum small line, this channel width called a quantum small line is too small in relation to an electron beam diameter generally used (e.g., 0.1 μm).

Supposing that electrons have an energy level expressed by x in one-dimensional small line direction and y in the thickness direction, $En=Ex+Ey+h^2k^2/2 \cdot m$ must be set to be about $3kT/2$ or less (where k is a Boltzman constant and T is an absolute temperature). Therefore, the small line width is, for example, approximately 5 nm which is as 1/100 time small as a generally used electron beam diameter. In laboratories, line width reduction is carried out by controlling the developing time and the likes. However, since changes in line width due to time-based changes in currents of electron beams and changes in line width due to local dispersion in resist film thickness are greater than an allowable value, it is difficult to stably form a number of elements on one same substrate.

To overcome this problem, developments have been made to a method of using a highly accurate film formation technique such as a molecular beam epitaxial growth method or the like which is capable of controlling an atom first layer, and of etching a layered film formed by this method at right angles or at a certain angle, and of using a side surface of the layered film as a gate controlled at a high accuracy.

However, this method results in a structure in which gate electrodes are layered and embodied. Therefore, to independently provide a plurality of gates with contact wirings, when a plurality of elements are formed on one same substrate, for example, it is necessary to open contact holes by etching from their upper side and to form wirings.

In this kind of wiring method, when a wiring is connected to a layer formed at a deep position, this wiring may be short-circuited with a wiring layer positioned at a shallow position. In addition, the thickness of layered films is extremely small, and it is therefore very difficult to end at any one of the layered films with a high controllability. For these reasons, it is difficult to provide independent contacts and wirings to respectively apply a plurality of gate electrodes with independent voltages, when a plurality of elements are formed. Actually, it is very difficult to form a plurality of transistors which use the side surface of layered films as gates, on one same substrate. For these reasons, a fine small integrated circuit cannot be obtained.

Meanwhile, a MOS electric field effect transistor (MOSFET) having a source, a drain, and a gate has been known as a semiconductor switching element. This transistor is variously used in semiconductor memories and other elements. In accordance with recent progress of semiconductor processing technology, down-sizing of MOSFETs and high integration have been developed more and more. In this kind of switching element, as down-sizing and high integration of MOSFETS are progressed, changes in punch-through and threshold voltage have come to occur due to short channel effects and narrow channel effects, thereby causing a problem of parasitic transistors.

To solve the above problem, lowering of temperature at which impurity doping and reduction in film thickness of gate insulating films must be taken into consideration, and therefore, the processing step for forming a semiconductor switching element is lengthened and complicated.

In addition, as an electronic device using the quantum tunnel effects of electrons, a device made by modulating the electric potential of a quantum well of a resonance tunnel diode thereby to form a transistor, and to a single electronic transistor.

FIG. 2 shows a conceptual view of the single electronic transistor. This device has a structure in which a charge storage conductive region 3 is tunnel-connected with a source or a drain electrode 1, and a tunnel current flows between the source and drain. Further, current control is performed in such a manner in which the electric potential of the charge storage conductive region 3 is changed by the voltage of the gate electrode 2, thereby to modulate the tunnel provability. In this case, since the tunnel provability has an indexical dependence on the thickness of the barrier layer 4, a tunnel barrier layer 4 having a controllability approximately equivalent to an atomic layer must be formed in order to realize an element with a high reproducibility.

Here, in case of a single electronic transistor in which a tunnel barrier layer 4 is formed by lithography, it is difficult to control the tunnel barrier to be approximately equivalent to an atomic layer. In addition, if the gate electrode 2 is not formed to match with the electrically conductive region 3, the capacities of them are changed, thereby making it difficult to form a single electronic transistor with a high reproducibility.

On the other hand, if a molecular beam epitaxial growth method (MBE) or an organic metal CVD method (MOCVD) is used, it is possible to layer a tunnel barrier at an accuracy approximately equivalent to an atomic layer. However, in case of a single electronic transistor adopting these layering methods, lithography is used to process a gate electrode in a direction perpendicular to the layering direction, and therefore, it is difficult to provide a distance between the gate electrode and the electrically conductive region 3 with a high controllability. This results in difficulties in control of the capacity of the electrically conductive region 3 by the gate electrode 2, and therefore, it is difficult to form a single electronic transistor with a high reproducibility.

As shown in FIG. 4, a method has been proposed in which a layered structure is formed on a semiconductor substrate by epitaxial growth, a mesa 15 is further formed thereon, and a gate insulating film 9 and a gate electrode 2 are formed on the mesa. However, in this method, the mesa 15 exposed on the surface before formation of a gate insulating film becomes channel regions 3 and 5 of a transistor, and therefore, the transistor is easily influenced by defects on an interface, thus resulting in a drawback that the reproducibility of the carrier density of a channel is low. The GaAs layer 13 and the AlGaAs layer 14 form the mesa.

The above problem occurs not only in a single electronic transistor but also in a device which uses quantum tunnel effects and controls the electric potential of the conductive region in contact with a tunnel barrier, by means of an insulating gate.

As has been explained above, in a plane type gate structure, there are difficulties in super down-sizing and in size control caused by lithography techniques, the side surface. Meanwhile, in a method of using the side surface of layered films as gates, there are difficulties in making contacts with gates and forming wirings thereto. Due to these difficulties, it is very difficult to form and integrate a plurality of transistors having super fine small gates, on one same substrate.

In case of a semiconductor switching element, there is a limit in super down-sizing and high integration of an element due to restrictions in a processing step.

In a device in which quantum tunnel effects are used and the electric potential of the conductive region in contact with a tunnel barrier is controlled by an insulating gate, it is difficult to form a tunnel barrier with a high reproducibility and realize a distance between a gate and a conductive region with a high reproducibility.

SUMMARY OF THE INVENTION

The present invention has an object of providing an improved semiconductor device, and specifically has objects as follows.

(1) To provide a semiconductor device integrating a plurality of super fine small gates an element structure, and an element structure and a manufacturing method which realize the semiconductor device.

(2) To provide a semiconductor device such as an electronic wave interfering element, which is capable of including a switching function with use of a principle different from a MOSFET and is more suitable for down-sizing and high integration.

(3) To provide a semiconductor device which is capable of restricting dispersion of tunnel barriers between elements and of realizing a constant distance without causing positional mismatching between gates and conductive regions, and which can be subjected to higher down-sizing, and a manufacturing method thereof.

A semiconductor device according to a first aspect of the present invention comprises: a substrate; a first conductive layer formed on the substrate with a first insulating layer inserted therebetween, thereby to constitute a first gate electrode, a second conductive layer selectively formed on the first gate electrode with a second insulating layer inserted therebetween; and a third conductive layer formed on the first and second conductive layer, thereby to constitute first and second electrodes respectively connected to the first and second conductive layers.

The first and second conductive layers may be formed as films by a molecular beam epitaxial growth method.

The semiconductor device may further comprise at least one fourth conductive layer selectively formed at an upper portion of the second conductive layer and connected to the third conductive layer.

One of the second and fourth conductive layers which is formed in the side of the substrate may be connected to the third conductive layer through the conductive layers formed at a portion close to the third conductive layer.

Means for connecting the first and second conductive layers with the third conductive layer may be formed as a film by a molecular beam epitaxial growth method.

The semiconductor device may further comprise a fifth conductive layer, formed on the third conductive layer, connected to the third conductive layer, and having a thickness greater than the third conductive layer.

The semiconductor device may further comprise an HEMT element formed on the side surfaces of the first and second gate electrodes by a molecular beam epitaxial growth method.

A method of manufacturing a semiconductor device according to the first aspect of the present invention comprises a step of forming a first conductive layer to constitute a first gate electrode on a semiconductor substrate, with a first insulating layer inserted therebetween, a step of selectively forming a second conductive layer on the first gate electrode, with a second insulating layer inserted therebetween, and a step of forming a third conductive layer at an upper portion of the first and second conductive layers, thereby to constitute first and second electrodes respectively connected to the first and second conductive layers.

According to the first aspect of the present invention, it is possible to form an integrated circuit in which a plurality of elements each using the side surface of a layered film as a gate are integrated on one same substrate, by connecting gate electrodes to different layers. Specifically, according to the first aspect of the present invention, devices each using an extremely narrow gate width of several tens nm are arranged adjacent to each other with an interval of several tens nm inserted therebetween, and a plurality of elements capable of independently controlling their potentials are integrated and formed in one same substrate.

The subject matter of a semiconductor device according to a second aspect of the present invention is that a phenomenon that the phase of a carrier wave function is modulated by applying an electric field is used for switching.

Specifically, the semiconductor device according to the second aspect of the present invention comprises: input and output electrodes formed to be electrically separated; and means for applying a desired electric field to at least one portion of at least one of a plurality of carrier transfer channels formed on a mesa in a direction vertical to a carrier transfer direction between the input and output electrodes, thereby changing energy level of the carrier transfer channels, to modulate an electric wave passing through the carrier transfer channels; wherein carrier transfer between the input and output electrodes is controlled by thus modulating the electronic wave.

Another semiconductor device according to the second aspect of the present invention comprises: input and output electrodes formed on a substrate to be electrically separated; means for forming a plurality of control electrode layers between the input and output electrodes in a direction vertical to the substrate surface, for applying a potential to at least one of the control electrode layers, and for forming a plurality of carrier transfer channels in at least one of the layers in a direction vertical to a carrier transfer direction between the input and output electrodes; and means for applying a desired electric field to at least one portion of at least one of the carrier transfer channels, thereby changing energy level of the carrier transfer channels, to modulate an electronic wave passing through the carrier transfer channels, wherein carrier transfer between the input and output electrodes is controlled by thus modulating the electronic wave.

In case of a conventional semiconductor switching element using a MOSFET, short channel effects, narrow channel effects, and changes in threshold voltage during operating periods of the element result in a problem of deterioration in switching functions. This deterioration occurs because inversion layers to exist on an $Si$—$SiO_2$ interface are not formed due to the short channel effects and narrow channel effects.

In this respect, the deterioration is switching function can be reduced if the switching operation is not performed by forming an inversion layer with use of a gate voltage, but is performed in a manner in which an electric field is applied to the carrier wave function, so that the phase of the wave function is changed thereby to make two wave functions having different phases interfere each other, as in the second aspect of the present invention.

Therefore, according to the present invention, since the phenomenon that the phase of the carrier wave function is modulated by applying an electric field is thus used for switching, the switching function is realized with use of a principle different from a MOSFET, and as a result, it is possible to realize a semiconductor device such as an electronic wave interfere element which is suitable for high integration.

The subject matter of a semiconductor device according to a third aspect of the present invention is that a first layered structure including a gate is formed on a substrate, a mesa is thereafter formed on the surface of the structure, and a second layered structure including a tunnel barrier region is formed on the mesa. The present invention is characterized in that an electric potential to be used as a tunnel barrier is formed not by lithography but by the first or second layered structure with a high reproducibility.

Specifically, the semiconductor device according to the third aspect of the present invention comprises: a first electrode grown and formed on a substrate; a mesa formed so as to have a contact with the first electrode; a first conductive layer grown and formed on the mesa, and having a carrier density which is changed by a voltage of the first electrode; a second conductive layer grown and formed on the mesa; and a tunnel barrier formed between the first conductive layer on the mesa and the second conductive layer, wherein a wave function relating to carriers of the first conductive layer is spatially and partially overlaps a wave function of the second conductive layer.

According to the third aspect of the present invention, epitaxial techniques can be used to form gates and tunnel barriers, so that films can be layered at an accuracy equivalent to an atomic layer level. Therefore, it is possible to restrict dispersion of tunnel barriers and gates in one direction to a constant level. In addition, since films can be layered with a high controllability in the second layered direction on the mesa, dispersion in sizes with respect to two directions can be restricted and the films can be thinned to a wave-length level of electrons, so that quantum enclosing in two directions can be easily realized.

Further, since potential changes of the first layered structure correspond to changes in electron density of a conductive region in the second layered structure, it is possible to form an electric conductive region without mismatching with a gate electrode formed by the first layered structure. In addition, since the electric conductive region can be formed at a position apart from a mesa, less influences are effected from defects on a mesa generated during mesa-etching process. Further, a new gate can be added to the substrate surface, a dual gate structure can be easily realized, and electrodes can be easily formed from the substrate surface.

According to the third aspect of the present invention, since a first layered structure including a gate is formed on a substrate and a second layered structure including a tunnel barrier region is formed on the mesa, a potential to be used as a tunnel barrier can be formed not by lithography but by the first or second layered structure with a high reproducibility. Therefore, it is possible to provide a semiconductor device and the manufacturing method thereof, by which dispersion of tunnel barriers can be reduced between elements, which can be realized without positional mismatching between a gate and a conductive region but with a constant interval, and which can be subjected to higher down-sizing.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 5 shows an example of an element structure of a semiconductor device according to the first embodiment of the present invention;

FIGS. 6A to 6E show an example of steps for manufacturing the semiconductor device;

FIG. 20 is a sectional view cut along an arrow 17C—17C of FIG. 17;

FIG. 21 is a sectional view showing a first stage of a manufacturing step of a sixth embodiment;

FIG. 22 is a sectional view showing a second stage of the manufacturing step of the sixth embodiment;

DETAILED DESCRIPTION OF THE PREFERRED EMBODIMENTS

Figure 1:
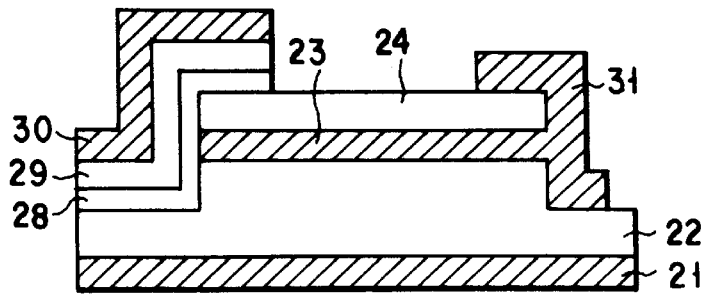
FIG. 1 shows an example of a structure of a conventional semiconductor device.
Figures 2, 3:
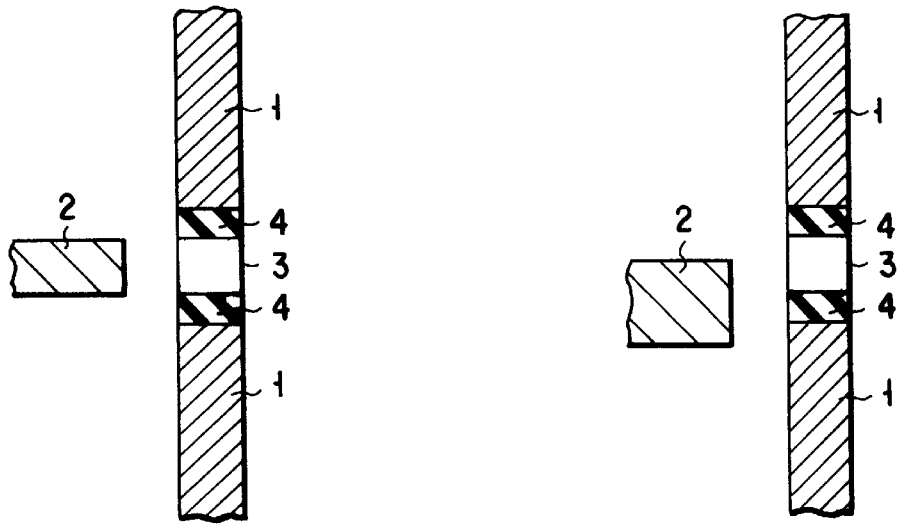
FIG. 2 is a conceptual view showing a single electronic transistor.
FIG. 3 is a view explaining problems of a single electronic transistor.
Figure 4:
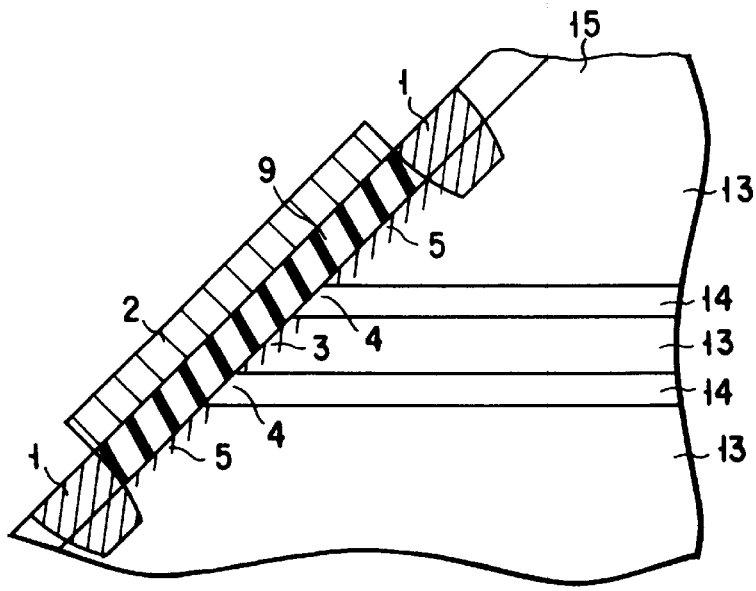
FIG. 4 is a sectional view showing a single electronic transistor formed on a conventional mesa.

Embodiments of the present invention will be explained with reference to the drawings.

(First Embodiment)

FIG. 5 shows an element structure of a semiconductor device according to the first embodiment of the present invention. FIGS. 6A to 6E sequentially show manufacturing steps thereof.

In FIG. 5 and FIGS. 6A to 6E, a p-type GaAs layer 22 is formed by a molecular beam epitaxial growth method. In the next, an n-type GaAs layer 23 whose side surface is to be used as a first gate is formed by a molecular beam epitaxial growth method. This layer has a preferable film-thickness of, for example, 2 nm.

In the next, to obtain electric separation, a p-type GaAs layer 24 is formed by a molecular beam epitaxial growth method. Note that a preferable film-thickness thereof is, for example, 3 nm in case where a functioning element is obtained by a tunnel phenomenon, although the film-thickness differs depending on applications. When a p-type GaAs layer 24 is formed by a molecular beam epitaxial growth method as is shown in FIG. 6B, a film made of substances other than GaAs, e.g., made of $SiO_2$ is partially formed and patterning is performed by lithography or the like. Thereafter a p-type GaAs layer 24 is formed, and then, $SiO_2$ is removed by wet etching, thereby forming a first opening portion 40.

In the same manner, a second n-type GaAs layer 25-1 is selectively formed thereon by a molecular beam epitaxial growth method, and an n-type GaAs layer 25-1 is simultaneously formed on the first opening portion 40. Then, the first n-type GaAs layer 23 and the second n-type GaAs layer 25-1 are electrically connected with each other. Note that the same method as used for forming the first opening portion 40 is used to separate and form regions 25 and 25' obtained by electrically separating the second n-type GaAs layer 25-1 when a film is formed by the molecular beam epitaxial growth method.

In this embodiment, the region 25 is used to extract the first n-type GaAs layer 23 to an upper portion, and the region 25' is used as a second side surface gate. The same method as used for extracting the first n-type GaAs layer 23 to an upper portion is used to extract the second n-type GaAs layers 25 and 25' to an upper portion. In this state, electrodes 27 and 27' to which electrodes 25 and 25' are connected are electrically separated from each other by a third p-type GaAs layer 26, according to this embodiment. However, these electrodes may be connected with each other in applicative uses.

After the formation step shown in FIG. 6D is completed, the side surface is exposed with use of a technique such as lithography or the like. In this embodiment, etching is performed in a vertical direction. However, an inclined surface may be formed, for example, with use of appropriate wet etching conditions. This side surface may be extended in a vertical direction or may be inclined.

After the side surface is exposed, an appropriate cleaning means is used to remove impurities on the side surface. Then, dangling bond is terminated with use of hydrogen, and thereafter, vacuum suppressing is sequentially performed. Further, an HEMT structure consisting of a normal barrier layer 28, a GaAs well layer 29, and a doping layer 30 is formed by a molecular beam epitaxial growth method. As a result of this, an HEMT element using the first n-type GaAs layer 23 as a first gate, and an HEMT element using the region 25' of the second n-type GaAs layer 25-1 as a second gate are formed on the side surface portion, as is shown in FIG. 6E.

In the steps from FIG. 6A to FIG. 6E, after an HEMT element is made grow on the side surface, the HEMT element portion is separated with use of a method such as lithography or the like, and a contact wiring 31 is provided for a third n-type GaAs layer having a sufficient size. In this step, it is desirable to make a third p-type GaAs layer 26 have a sufficient thickness of about 0.2 $\mu$m, in order to avoid short-circuiting to the second n-type GaAs layer 25-1 due to processing dispersion when forming contacts.

(Second Embodiment)

Figure 7:
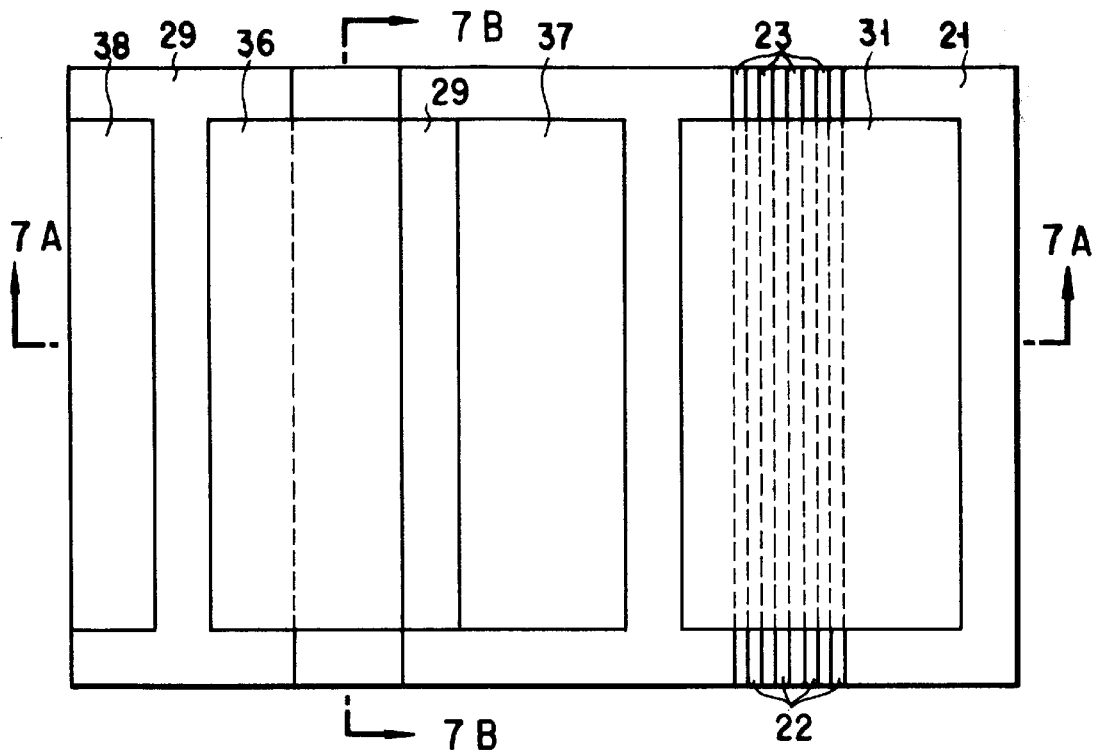
FIG. 7 is a plan view schematically showing the structure of an electronic wave interfering element according to the second embodiment of the present invention.
Figure 8:
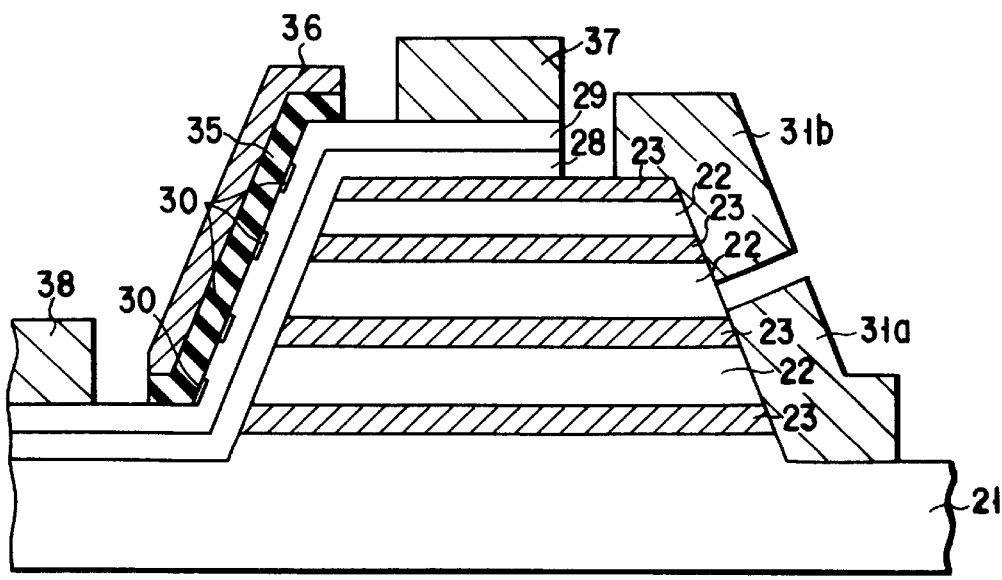
FIG. 8 is a sectional view cut along an arrow 7A—7A of FIG. 7.
Figure 9:
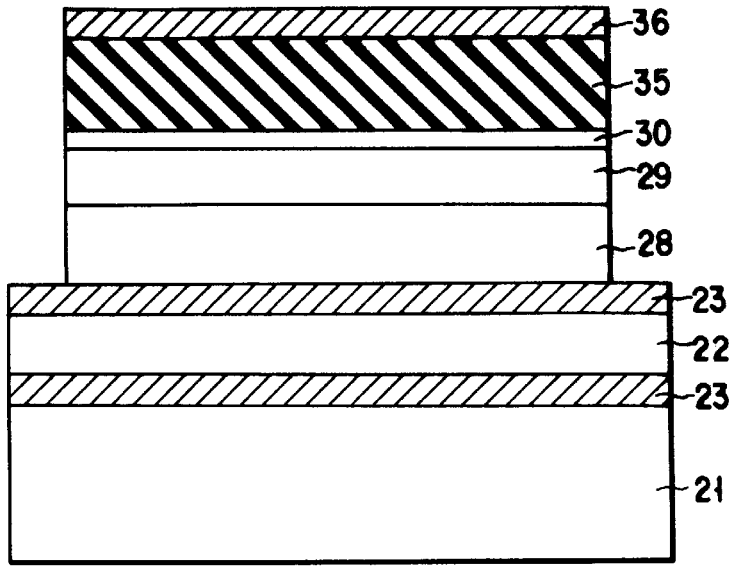
FIG. 9 is a sectional view cut along an arrow 7B—7B of FIG. 7.
Figure 10A:
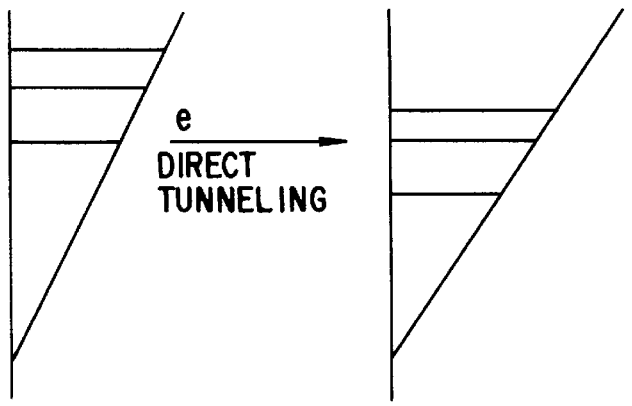
FIGS. 10A and 10B are schematic views showing an ON-state and an OFF-state of each gate region.
Figure 10B:
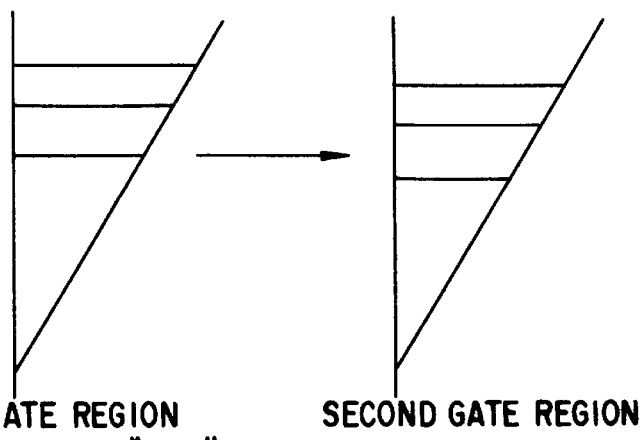

FIG. 7 is a plan view schematically showing the structure of an electronic wave interference element according to the second embodiment of the present invention, and FIG. 8 is a sectional view cut along an arrow 7A—7A of FIG. 7. FIG. 9 is a sectional view cut along an arrow 7B—7B of FIG. 7.

Carrier transfer paths 23 and p-type GaAs layers 22 are alternately layered on a p-type GaAs substrate 21. These layered films and substrate are etched such that (311) surfaces are exposed. Gate electrodes 31a and 31b are formed on one of the (311) surfaces exposed by etching, while a first barrier film 28, a well layer 29, a second barrier film 35, and a control electrode is formed on the other of the (311) surfaces. Then, the second barrier film and the control electrode 36 are partially etched and removed, thereby forming a source electrode (or input electrode) 37 and a drain electrode (or output electrode) 38 on the well layer 29.

In this structure, an electric field is selectively applied only between the n-type GaAs layer 23 and the control electrode 36 when a predetermined voltage is applied to the gate electrodes 31a and 31b, and the control electrode 36 is grounded. Therefore, several one-dimensional quantum thin line (or carrier transfer paths) 30 are formed in the well layer 29 in a direction vertical to the carrier transfer direction. Further, when a predetermined voltage is applied between the source and gate electrodes, electrons move to the drain electrode 38 from the source electrode 37, tunneling respective quantum thin lines 30.

This means, by applying an electric field to the quantum thin lines 30 through the n-type GaAs layer 23 to change the energy level of the quantum thin lines 30, it is possible to modulate electronic waves passing through the quantum thin lines 30, so that carrier transfer between the source and drain electrodes can be controlled by modulation of electronic waves.

In case of using the element structure as described above, electrons existing in the quantum thin lines 30 of an input portion are bound in two directions parallel with the paper surface, and behave as free particles in the direction vertical to the paper surface, so that the intrinsic energy of electrons can be expressed by the following relation.

$$En = Ex,n + Ey + \frac{h^2 kz^2}{2mZ_2} \quad (1)$$

In this relation, the x-direction is parallel to the n-type GaAs layer 23 and the y-direction is a vertical direction. Ex and Ey can be expressed as follows.

$$Ex,n = \left(\frac{h}{2mX}\right)^{1/3} \cdot \left\{\left(\frac{3}{2}\right)\rho e \cdot \epsilon X \cdot \left(n + \frac{3}{4}\right)\right\}^{2/3} \quad (2)$$

$$Ey = \frac{1}{2mY}\left(\frac{h}{LY}\right)^2 \quad (3)$$

∈: x-direction electric field n: 0, 1, 2, 3, . . .

mX (Y, Z): electron effective mass relating to x (y, z)-direction

LY: n-type GaAs film thickness h: plunk constant

From the above relations (1), (2), and (3), it is apparent that the energy intrinsic value is controlled by the electric field ∈x. Since electrons directly tunnel between states having an equal energy intrinsic value, the distance between the source and the drain can be rendered conductive.

Therefore, by changing the voltage applied to the first gate electrode 31a and the second gate electrode 31b to a predetermined voltage, the energy intrinsic value is changed in the first gate region and the second gate region, thereby controlling direct tunneling between energy intrinsic values. As a result of this, "ON" and "OFF" of currents can be controlled.

(Third Embodiment)

In the above electronic wave interference element, when the second barrier film 35 is formed of HEMT, a two-dimensional electron gas is generated in the HEMT film, so that the energy intrinsic value of the two-dimensional electronic gas can be controlled by applying a voltage to a control electrode 36. Further, direct tunneling through the quantum thin lines 30 and the HEMT can be controlled by applying a predetermined voltage to the first and second gate electrodes 31a and 31b and to the control electrode 36.

In this case, a transistor using transfer of electrons through a two-dimensional electronic gas in the HEMT can be formed by connecting ends of the quantum thin lines to the source and by connecting the other ends of the quantum thin lines to the drain, In the above embodiment, a carrier transfer path consisting of quantum thin lines is made of one layer. However, the carrier transfer path may be made of multiple layers. In this case, the well layer and the barrier layer may be made of a plurality of layers, thereby to form the quantum thin lines made of a plurality of layers.

(Fourth Embodiment)

Figure 11:
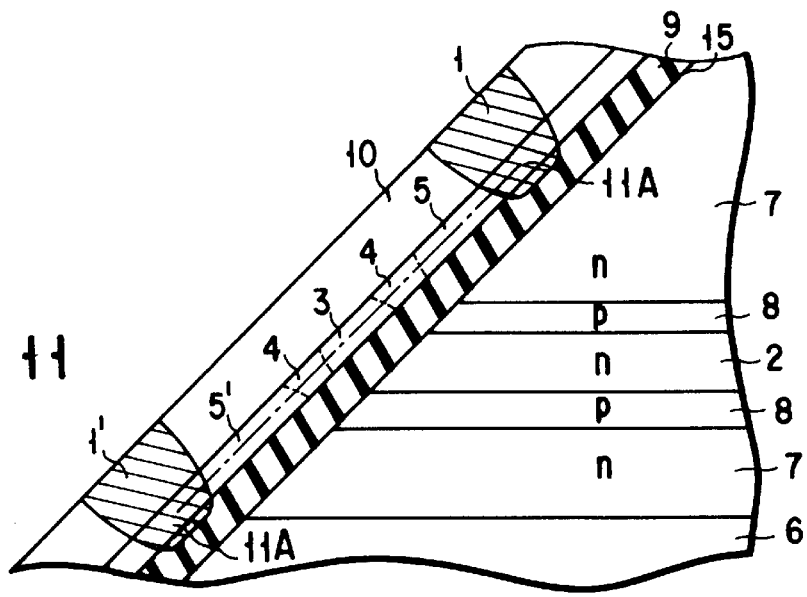
FIG. 11 is a sectional view showing a semiconductor device according to a fourth embodiment of the present invention.
Figure 12:
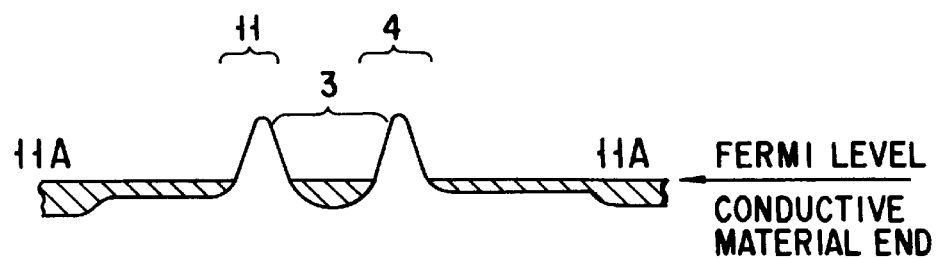
FIG. 12 is a graph showing the potential distribution with respect to electrons on the sectional surface cut along a line 11A—11A of FIG. 11.

FIG. 11 is a sectional view of an element structure according to the fourth embodiment of the present invention, and FIG. 12 is a sectional view cut along an arrow 11A—11A of FIG. 12.

A transistor region is formed on a semiconductor mesa 15, and a channel region is formed on an upper portion of the mesa 15 through a gate insulating film 9 with respect to the gate electrode 2. In the channel region, a first conductive layer 3, second conductive layers 5 and 5', and a tunnel barrier 4 are formed in the channel region. On the channel region, an epitaxial layer 10 is formed. An n-type diffusion layer is formed on the first conductive layer, and forms a source 1 and a drain 1' of a plane type MOS transistor.

On the substrate on which a semiconductor mesa is formed, an n-type semiconductor layer 7, a p-type semiconductor layer 8, an n-type semiconductor layer 2, a p-type semiconductor layer 8, and an n-type semiconductor layer 7 are epitaxially formed, and the layer 2 forms a gate electrode. Further, since the p-type semiconductor layers have a higher potential with respect to electrons than the n-type semiconductor layers, an electric potential barrier is formed against electrons and forms a tunnel barrier 4.

In this embodiment, the capacity inserting the tunnel barrier 4 is increased by enlarging the barrier thickness, and further, and an electric conductive region 3 of FIG. 12 is narrowed in the direction perpendicular to the paper surface, thereby reducing the capacity of the electric conductive region 3 with respect to the gate electrodes 2, 5, and 5', so that potential changes caused by 1-electronic charge can be observed and measured. Thus, a single electronic transistor is realized.

Figure 13:
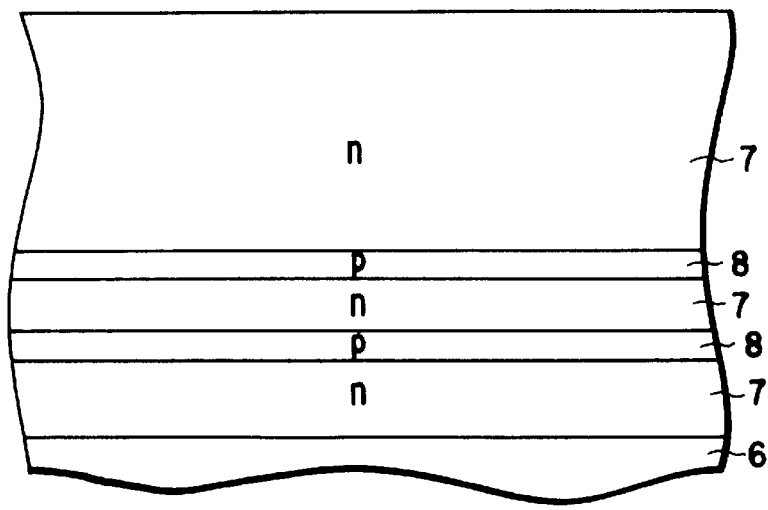
FIG. 13 is a sectional view showing a first stage of the manufacturing step of the fourth embodiment.
Figure 14:
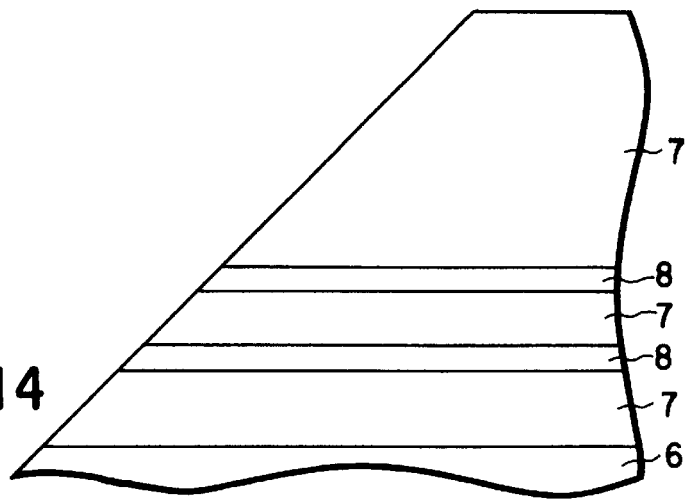
FIG. 14 is a sectional view showing a second stage of the fourth embodiment.
Figure 15:
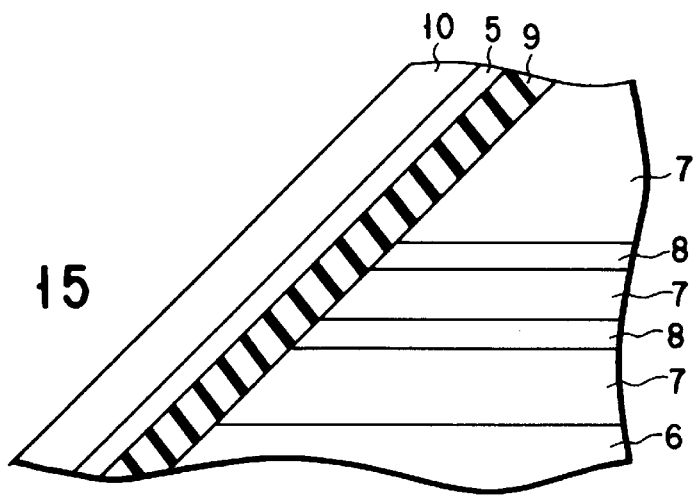
FIG. 15 is a sectional view showing a third stage of the fourth embodiment.

The manufacturing method of this embodiment will be explained. FIGS. 13 to 15 are sectional views showing steps, each cut from FIGS. 11.

At first, as shown in FIG. 13, for example, an n-type AlGaAs layer 7 having a silicon density of $10^{17}$ cm$^{-3}$, a p-type AlGaAs layer 8 having a beryllium density of $10^{18}$ cm$^{-3}$, an n-type GaAs layer 7 (or gate electrode 2) having a silicon density of $10^{18}$ cm$^{-3}$, a p-type AlGaAs layer 8 having a beryllium density $10^{18}$ cm$^{-3}$, and an n-type AlGaAs layer 7 having a silicon density $10^{17}$ cm$^{-3}$ are formed on a semi-insulating GaAs (100) substrate 6, by a molecular beam epitaxial growth method. The film-thickness of these layers are respectively 0.5 μm, 0.05 μm, 0.05 μm, and 0.20 μm. By performing addition of impurities during growth, a steep impurity distribution is formed. The mole ratio of AL to Ga is, for example, 0.25:0.75.

Next, portions other than the portion from which a mesa is to be extracted are covered by lithography and resist, and thereafter, a mesa is formed by anisotropic etching liquid, as is shown in FIG. 14. The depth of the mesa is set, for example, so as to reach the semiconductor substrate 6. Thereafter, resist is incinerated and removed.

Subsequently, as is shown in FIG. 15, for example, an n-type AlGaAs layer 9 having a silicon density $10^{17}$ cm$^{-3}$, a GaAs channel layer 5 including no impurities, and an epitaxial layer 10 are formed by a molecular beam epitaxial growth method. These layers are arranged so as to have a thickness of 0.1 μm or 0.3 μm.

Thereafter, for example, a source/drain diffusion layer 1 and an ohmic electrode with respect to a gate electrode 2 are formed with use of AuSi. When forming the gate electrode 2, selective etching for AlGaAs and GaAs is used, and the n-type AlGaAs layer 7 and p-type AlGaAs layer 8 are etched from the surface, so that selective contacts are made to the gate electrode 2 of n-type GaAs layer.

In this embodiment, the thickness of the first layered structure can be controlled with an accuracy of an atomic layer level, so that a tunnel barrier can be formed with a high reproducibility without use of lithography. In addition, another gate electrode 2' may be formed on the epitaxial layer 10, in this embodiment. Further, the n-type epitaxial layer 7 may be used as a gate electrode in place of using the gate electrode 2.

(Fifth Embodiment)

Figure 16:
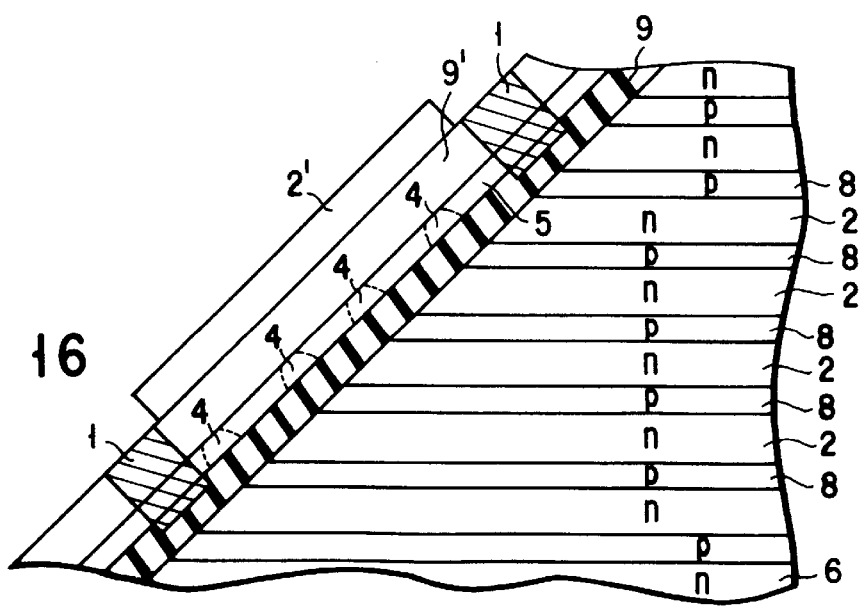
FIG. 16 is a sectional view of an element structure showing a semiconductor device according to a fifth embodiment of the present invention.

FIG. 16 is a sectional view of an element structure showing a semiconductor device according to the fifth embodiment of the present invention. Note that the same portions of FIG. 16 as those of FIGS. 11 and 12 are denoted by the same references, and the detailed explanation of those portions will be omitted herefrom.

The sectional structure of this embodiment is basically equal to the fifth embodiment, but is different therefrom in that a combination of a gate electrode 2 and a barrier forming p-type GaAs layer 8 is cyclically repeated thereby forming a super grid potential in a channel region, and that a gate electrode 2' is formed on the surface.

This structure is an embodiment of an application for a super grid FET. With use of this structure, the amplitude of the super grid potential is changed by changing the voltage of gate electrodes 2, and the entire electron density can be independently changed by the surface gate. Therefore, it is advantageous in that control of non-linear shapes such as Bragg reflection of the super-lattice can be easily achieved.

(Sixth Embodiment)

Figure 17:
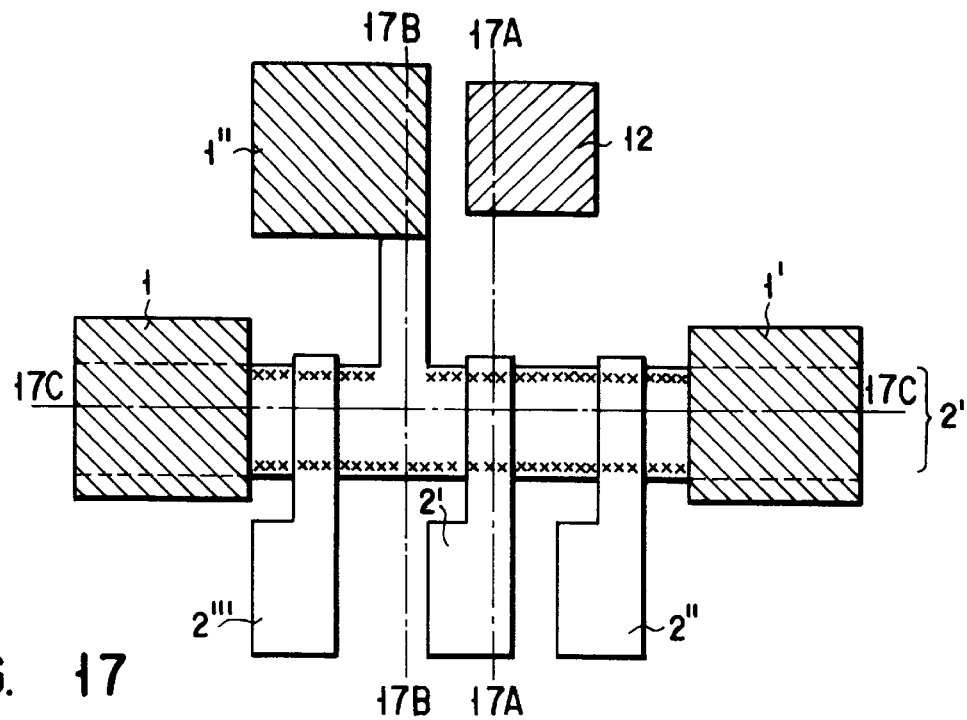
FIG. 17 is a plan view of an element structure showing a semiconductor device according to a sixth embodiment of the present invention.
Figure 18:
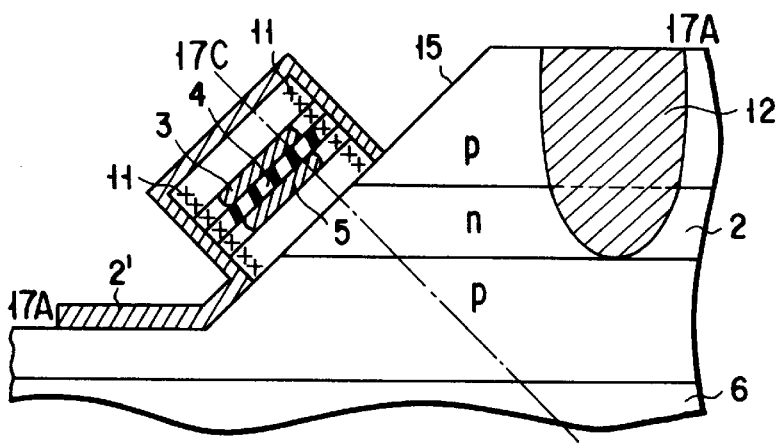
FIG. 18 is a sectional view cut along an arrow 17A—17A of FIG. 17.
Figure 19:
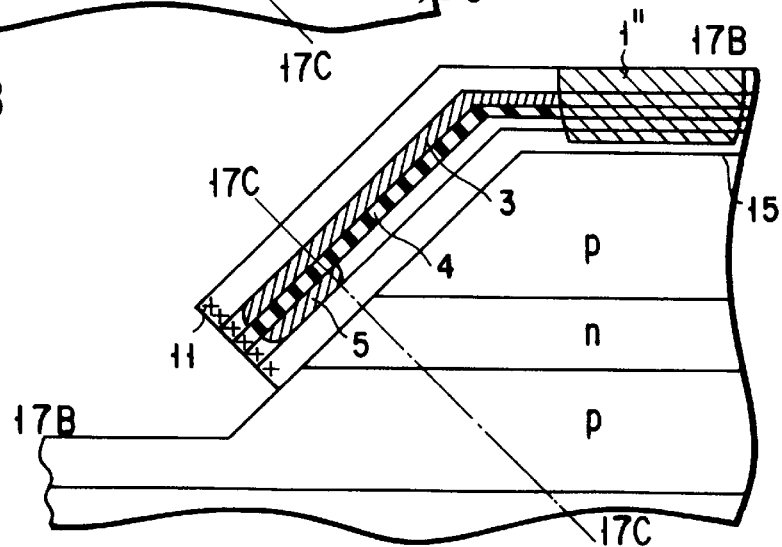
FIG. 19 is a sectional view cut along an arrow 17B—17B of FIG. 17.

FIG. 17 is a plan view showing an element structure of a semiconductor device according to the sixth embodiment of the present invention. FIGS. 18 to 20 are respectively sectional views cut along arrows 17A—17A, 17B—17B, and 17C—17C of FIG. 17. Note that the same portions of FIGS. 17 as those of FIGS. 11 and 12 are denoted by the same references, and detailed explanation thereof will be omitted herefrom.

This embodiment is different from the fourth and fifth embodiments in that the tunnel barrier 4 of this embodiment is formed in a direction vertical to the mesa surface and that the first conductive layer 3 and the second conductive layer 5 constitute a layered structure, while the tunnel barrier 4 of the fourth and fifth embodiment is formed in the direction parallel to the mesa surface 15. In this embodiment, an electronic wave direction bind type switch is recited as an example, in order to show that electrodes can respectively be prepared for the first conductive layer 3 and the second conductive layer 5.

An active device region is formed on the semiconductor mesa 15, and a channel region is formed at an upper portion of the mesa 15 with a gate insulating film 9 for a gate electrode 2 inserted therebetween. In the channel region, a first conductive layer 3, a tunnel barrier 4, a second conductive layer 5, a gate insulating layer 9' with respect to upper gate electrodes 2', 2", and 2'", and the upper gate electrodes 2', 2', and 2'" are formed in this order from the bottom of the channel region. In the first conductive layer 3 and the second conductive layer 5, n-type diffusion layer are formed and form a source 1 and drains 1' and 1". In the region where a gate is formed, a second layered structure is subjected to patterning, and a defective region 11 is formed by ion-implantation or diffusion in order to improve element separation when a voltage is applied to upper gates.

Here, a voltage is applied to the gate electrode 2 in the positive direction, and therefore, carriers exist in the second conductive layer 5 only on the gate electrode 2 where the potential with respect to electrons is lowered. Then, as shown in FIG. 19, the drain 1" which does not exist on the gate electrode 2 has a contact with respect to the first conductive layer 3. On the other hand, as shown in FIG. 20, the first conductive layer 3 can be selectively depleted by applying a negative voltage to the upper gate electrodes 2" and 2'". Therefore, the source 1 and drain 1' have contacts with only the first conductive layer 5.

An electronic wave direction binding type switch is a device which controls quantum mechanical binding between two conductive layers which can be tunneled, thereby to change current distributions for respective drains. This device requires independent contacts to respective conductive layers.

In the next, FIGS. 21 to 24 are used to explain manufacturing steps of the semiconductor structure of this embodiment. FIGS. 21 to 24 are sectional views showing steps corresponding to a cross section of FIG. 28.

At first, as shown in FIG. 21, for example, a p-type AlGaAs layer 8 having a beryllium density of $10^{18}$ cm$^{-3}$, an n-type GaAs layer 7 (or gate electrode 2) having a silicon density of $10^{18}$ cm$^{-3}$, and a p-type AlGaAs layer 8 having a beryllium density $10^{18}$ cm$^{-3}$ are formed, for example, by a molecular beam epitaxial growth method. These layers respectively have film-thicknesses of, for example, 0.5 $\mu$m, 0.05 $\mu$m, and 0.20 $\mu$m. By simultaneously performing addition of impurities during growth of the layers, a sharp impurity distribution is formed. The mole ratio of Al to Ga of AlGaAs is, for example, 0.25:0.75.

Next, portions other than the portion where a mesa is extracted are covered by lithography and resist, and thereafter, a mesa is formed by anisotropic etching liquid such as bromomethanol, for example, as shown in FIG. 22. The depth of the mesa reaches, for example, the lower p-type AlGaAs layer 8. Thereafter, the resist is incinerated and removed.

Figure 23:
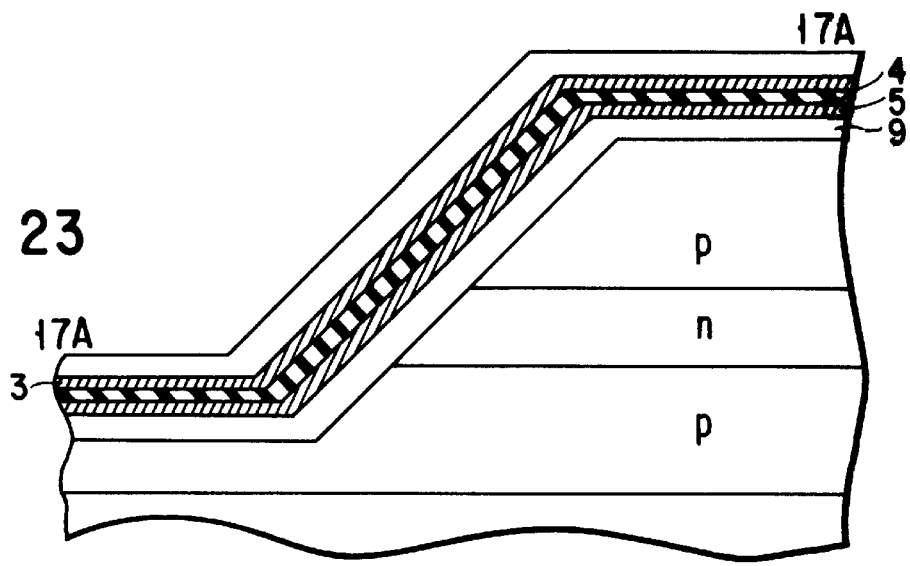
FIG. 23 is a sectional view showing a third stage of the manufacturing step of the sixth embodiment.

Subsequently, as shown in FIG. 23, for example, an n-type AlGaAs layer 9 having a silicon density of $10^{17}$ cm$^{-3}$, a GaAs channel layer 5 not added with impurities, an AlAs tunnel barrier layer 4 not added with impurities, a GaAs channel layer 23 not added with impurities, and an n-type AlGaAs layer 9' having a silicon density of $10^{18}$ cm$^{-3}$ are formed by a molecular beam epitaxial growth method. These layers respectively have film-thicknesses of, for example, 0.1 $\mu$m, 0.03 $\mu$m, 0.01 $\mu$m, 0.03 $\mu$m, and 0.05 $\mu$m.

Figure 24:
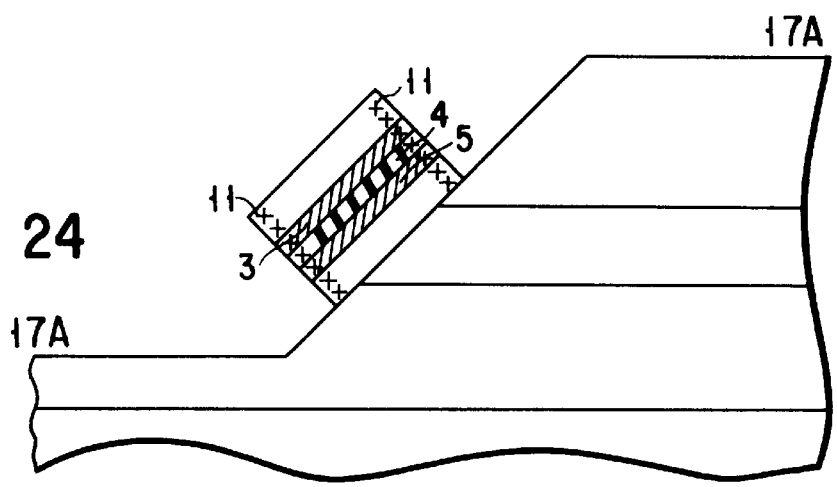
FIG. 24 is a sectional view showing a fourth stage of the manufacturing step of the sixth embodiment.

Next, as shown in FIG. 24, a second layered structure is etched with use of lithography and etching, and thereafter, inversion preventing defects 11 are formed at its etching edges by ion-implantation. Otherwise, this etching may be performed by reactive ion-etching, and etching damages thereof may be used in place of the defects 11.

Thereafter, for example, source/drain diffusion layer 1 and an ohmic electrode with respect to a gate electrode 2 are formed with use of AuSi. To form the gate electrode 2, selective etching of AlGaAs and GaAs is used, and the etching is performed from the surface to the p-type AlGaAl layer 8, thereby selectively making contacts with the gate electrode 2 of the n-type GaAs layer.

In this embodiment, since a tunnel barrier is formed in the layered direction, a sharp hetero structure can be realized, so that a more uniform and excellent tunnel element can be easily realized. Further, the distance between the gate electrode 2 and the second conductive member 5 can be reproduced from the back side with an excellent reproducibility, which causes a problem in a conventional electronic wave direction bind type switch using a quantum well, and the electrode 2 can be prepared from the front surface, so that a device can be formed with a higher controllability.

(Seventh Embodiment)

Figure 25:
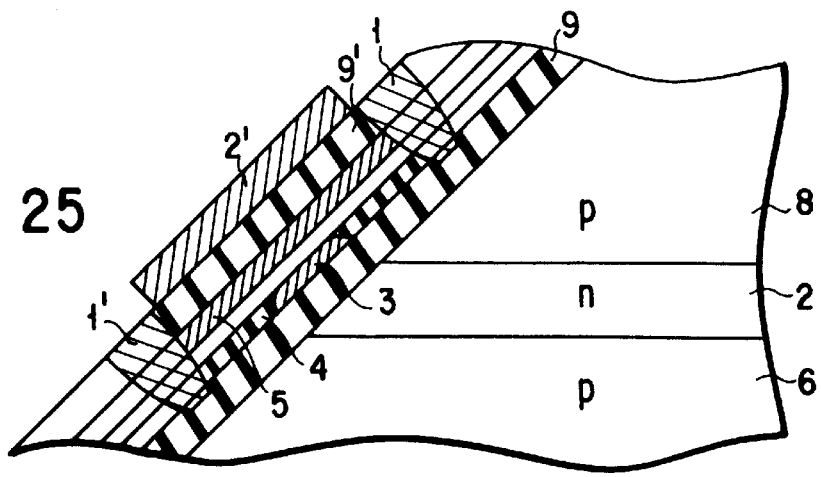
FIG. 25 is a sectional view of an element structure showing a semiconductor device according to a seventh embodiment.

FIG. 25 is a sectional view of an element structure of a semiconductor device according to the seventh embodiment. Note that the same portions of FIG. 25 as those of FIGS. 11 and 12 are denoted by the same references, and detailed explanation thereof will be omitted herefrom.

In this embodiment, a tunnel barrier 4 is formed in the direction perpendicular to the mesa surface, and the first conductive layer 3 and the second conductive layer 5 constitute a layered structure. In addition, the second conductive layer 5 operates as a channel for the transistor, and is connected to a source and drain diffusion layers 1 and 1'. The first conductive layer 3 operates as a floating gate, and is coupled with a control electrode 2 to function as an EPROM. The manufacturing steps of this embodiment are substantially equal to the sixth embodiment, and explanation thereof will be omitted herefrom.

In this embodiment, since an epitaxial growth method which provides a very high thickness-controllability is used to form a tunnel barrier, a barrier can be formed with an excellent film-thickness controllability, even when a normal silicon oxide film is more thinned than an EPROM used for a tunnel barrier or a hot electron barrier. In addition, the width of an n-type layer of the gate electrode 2 can be narrowed and can be highly integrated with ease, without depending on lithography.

Note that the present invention is not limited to the embodiments described above. Although the above embodiment adopt a molecular beam epitaxial method (MBE) as a method of forming a layered film, it is possible to use another epitaxial growth method, such as an organic metal CVD method (MOCVD), a liquid phase growth method (LPE), or the like, by which films can be layered with an accuracy of an atomic layer level.

In addition, although materials 7 and 8 forming layered films and the substrate 6 which are exemplified in the above embodiments are AlGaAs/GaAs based, AlGaAs may be replaced with InAlAs or GaAs may be replaced with GaInAs, InP, or Si. Further, the Si/SiGe based materials, CaF2/GaAs based materials, and the material of the gate electrode 2 may be cobalt silicide or nickel silicide. In addition, AlGaAs used as the materials for first and second layered films may be replaced with GaAs, or the converse is possible. These materials may be combined as a combination film to practice the above embodiments. In this case, as for impurities to be added, silicon may be replaced with germanium or copper, or beryllium may be replaced with zinc, if necessary. In case of Si/SiGe based materials, P, As, and Sb may be used as n-type impurities while B, Al may be used as p-type impurities.

Although the above embodiments explain a method of uniformly adding impurities, it is possible to δ doping by which impurities can be added to a certain growth surface, to form a sheet-like shape. In this case, the surface density of impurities is, for example, $10^{12}$ to $10^{13}$ cm$^{-2}$. In the above embodiments, although an anisotropic wet etching method using bromomethanol has been adopted to form a mesa, a reactive ion-etching method may be used. Although a method of incinerating is adopted to remove resist, resist may be removed with use of an organic solvent. In addition, although a semiconductor structure is formed on a GaAs substrate in the above embodiments, an SOI substrate, a GaAs substrate, and an InP substrate may be used instead.

In the sixth and seventh embodiments, an epitaxial growth method is used to form a conductive layer and a gate insulating film 9' after formation of a tunnel barrier. However, the method of forming the conductive layer and gate insulating film is not always limited to the epitaxial growth method in this case. In addition, a conductive layer made of two layers has been adopted in the sixth and seventh embodiments, this conductive layer may be made of three or more layers. In the fifth embodiment, as far as a plurality of gate electrodes 2 are used, the number of gate electrodes is not particularly limited. Although the above embodiments use a structure in which the gate insulating film is added with impurities, the gate insulating film need not be added with impurities.

Further, the present invention can be variously modified in practice without deriving from the scope of the invention.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor comprising
   a substrate;
   a first conductive layer formed on the substrate with a first insulating layer inserted therebetween, thereby to constitute a first gate electrode;
   a second conductive layer, at least a portion of which constitutes a second gate electrode, selectively formed on the first gate electrode with a second insulating layer inserted therebetween; and
   a third conductive layer formed on the first and second conductive layer, thereby to constitute first and second electrodes respectively connected to the first and second conductive layers;
   wherein said second conductive layer is divided into at least two regions and at least said first conductive layer is connected to said third conductive layer via one of the regions of the second conductive layer, formed between said first conductive layer and said third conductive layer.

2. A semiconductor device according to claim 1, wherein the first and second conductive layers are coupled to the third conductive layer by a conductive film by a molecular beam epitaxial growth method.

3. A semiconductor device according to claim 1, further comprising a fourth conductive layer, formed on the third conductive layer, coupled to the third conductive layer, and having a thickness greater than the third conductive layer.

4. A semiconductor device comprising:
   a substrate;
   a first conductive layer formed on the substrate with a first insulating layer inserted therebetween, thereby to constitute a first gate electrode;
   a second conductive layer, at least a portion of which constitutes a second gate electrode, selectively formed on the first gate electrode with a second insulating layer inserted therebetween;
   a third conductive layer formed on the first and second conductive layer, thereby to constitute first and second electrodes respectively connected to the first and second conductive layers; and
   an HEMT element formed on the side surfaces of the first and second gate electrodes by a molecular beam epitaxial growth method.

5. A semiconductor device comprising:

input and output electrodes, which is electrically separated, formed on a mesa-type substrate; and means for applying an electric field to at least one portion of at least one of a plurality of carrier transfer channels formed on said mesa-type substrate in a direction vertical to a carrier transfer direction between the input and output electrodes, thereby changing energy level of the carrier transfer channels, to modulate an electronic wave passing through the carrier transfer channels; wherein carrier transfer between the input and output electrodes is controlled by thus modulating the electronic wave.

6. A semiconductor device comprising:

input and output electrodes formed on a substrate to be electrically separated;

means for forming a plurality of control electrode layers between the input and output electrodes in a direction vertical to the substrate surface, for applying a potential to at least one of the control electrode layers, and for forming at least one carrier transfer channels on at least one of the layers in a direction vertical to a carrier transfer direction between the input and output electrodes; and means for applying an electric field to at least one portion of at least one of the carrier transfer channels, thereby changing energy level of the carrier transfer channels, to modulate an electronic wave passing through the carrier transfer channels, wherein carrier transfer between the input and output electrodes is controlled by thus modulating the electronic wave.

7. A semiconductor device comprising:

a first electrode grown and formed on a substrate;

a mesa formed so as to have a contact with the first electrode;

a first conductive layer grown and formed on the mesa, and having a carrier density which is changed by a voltage of the first electrode;

a second conductive layer grown and formed on the mesa; and a tunnel barrier formed between the first conductive layer on the mesa and the second conductive layer, wherein a wave function relating to carriers of the first conductive layer spatially and partially overlaps a wave function of the second conductive layer.

8. A semiconductor device according to claim 7, said second conductive layer is placed by the side of said first conductive layer via said tunnel barrier.

9. A semiconductor device according to claim 7, said second conductive layer is formed on said first conductive layer via said tunnel barrier.

* * * * *